United States Patent [19]
Isohata

[11] 3,982,627
[45] Sept. 28, 1976

[54] AUTOMATIC WAFER ORIENTING APPARATUS

[75] Inventor: Junji Isohata, Tokyo, Japan

[73] Assignee: Canon Kabushiki Kaisha, Tokyo, Japan

[22] Filed: Mar. 11, 1975

[21] Appl. No.: 557,294

[30] Foreign Application Priority Data
Mar. 13, 1974 Japan.................................. 49-28843

[52] U.S. Cl................................ 214/1 Q; 198/380; 302/2 R; 198/394
[51] Int. Cl.² .................................. B65G 47/24
[58] Field of Search ....................... 302/2 R, 29, 31; 198/257, 261, 262, 263, 283; 214/1 BE

[56] References Cited
UNITED STATES PATENTS

| | | | |
|---|---|---|---|
| 2,293,553 | 8/1942 | Magnusson........................ | 198/261 |
| 3,297,134 | 1/1967 | Pastuszak......................... | 198/257 |
| 3,797,889 | 3/1974 | Wilkinson......................... | 302/2 R |

OTHER PUBLICATIONS
IBM Technical Disclosure Bulletin, vol. 14, No. 4, p. 1021; Sept. 1971; "Wafer Orientator" by Fox et al.

Primary Examiner—Evon C. Blunk
Assistant Examiner—Jeffrey V. Nase
Attorney, Agent, or Firm—Toren, McGeady and Stanger

[57] ABSTRACT

An apparatus for automatically orienting wafers of semiconductive material to a desired position individually, each wafer having a round periphery provided with a linear or recessed portion formed therein and with a pair of resultant edges formed at the points of intersection between that portion and the other portion to serve as a distinctive physical feature with which a mechanism interacts to impart an orientation to the wafer in cooperation with an idler. This mechanism comprises a rotary head and a guide abutment positioned adjacent with each other on a horizontally disposed wafer support plate having a number of holes switchable between vacuum and pressure in an area on which the wafer is placed so that while being slightly floated from the support surface and impelled to abutting engagement with the rotary head and the idler arranged in spaced relation to each other on the opposite side of the rotary head to the guide abutment, the wafer is rotated by the rotary head until one of the pair of edges strikes said flat guide surface at a point from which it is slidingly moved in a linear direction along the flat guide surface of the abutment to a certain point where the rotary head imparts no further rotative movement to the wafer.

21 Claims, 8 Drawing Figures

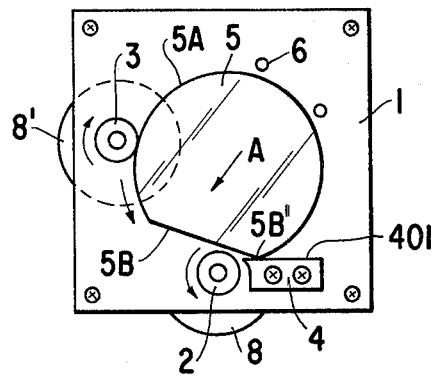
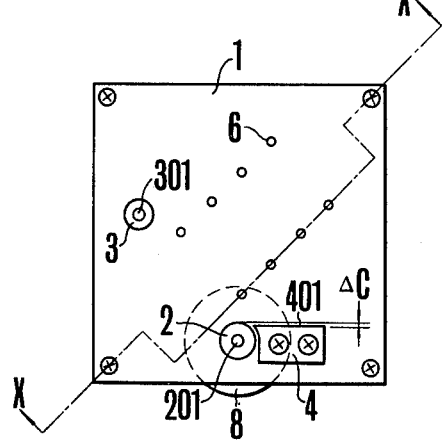
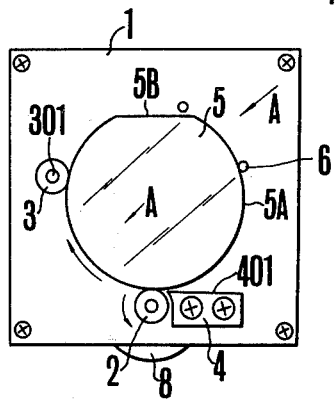
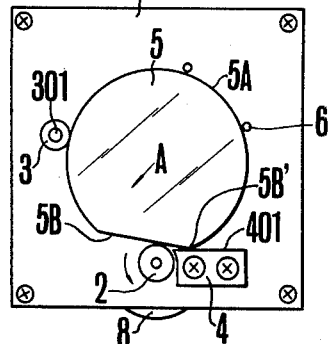
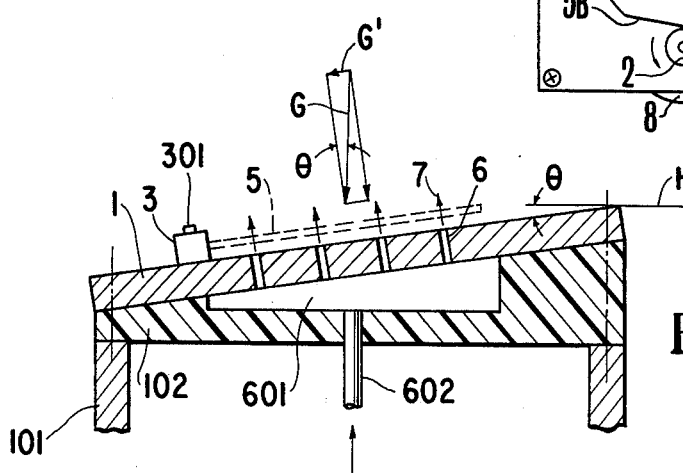

AUTOMATIC WAFER ORIENTING APPARATUS

BACKGROUND OF THE INVENTION

This invention relates to an apparatus for automatically orienting a wafer of semiconductive material to a desired position relative to the distinctive peripheral feature of the wafer.

In the manufacture of solid state devices such as transistors and integrated circuits on a single semiconductive wafer using a multistep photomechanical reproduction process, each of the successive photoresist mark alignment and fabricating steps requires that the wafer be accurately placed in a predetermined orientation position at a predetermined location. In more detail, a wafer is given to apply on its surface a photosensitive layer made of such as Photo Resist, and is then transferred to a printing station where the surface is selectively exposed through a photomask to define a plurality of impurity diffusion areas. This photomask printing operation is performed in alignment of the photomask with the wafer, after the randomly oriented wafer has been oriented to a desired position at a predetermined location on a support plate. To impart such orientation to the wafer, a distinctive physical feature has to be formed in the periphery thereof to serve as the orientation reference. For example, a linear or recessed peripheral portion is distinctively formed with respect to the other round peripheral portion, the linear portion being commonly called "orientation-flat" or "orientation-cut", and the recessed portion "orientation-notch". As a general term for these terms will be hereinafter used "orientation reference portion". It has been the practice of the prior art in the orientation of each wafer that the operator manually brings the orientation reference portion into engagement with a certain orientation abutment member in the orientor station. The inclusion of manual orienting steps in the manufacture of the solid state devices on a semiconductive wafer not only considerably slows the overall production capability, but also reduces the accuracy of orientation control depending upon the personal experience of the operator.

In order to eliminate the above-mentioned drawbacks, a solution has been proposed as, for example, in an automatic wafer orienting apparatus disclosed in Japanese open Pat. No. Sho 47-24775. This apparatus is adapted to orient a wafer having an orientation-cut, employing a plurality of guide rollers arranged to define an area of rotation of the wafer about its axis as it is rotated by a rotary support plate, and an orientation sensor connected to the drive means for the rotary support plate upon interaction with the orientation-cut to automatically terminate the driving of the rotary support plate, whereby the orientation of the wafer to a desired position is effected. A major problem of this apparatus is that, due to the fragility of the semiconductive wafers which is particularly serious for silicon wafers each having a thickness of about 0.04 cm and a diameter of more than 2.5 cm, the guide rollers as arranged along the circumference of the wafer destroy many wafers by cracking, chipping-off, or imparting stress to the wafer body, as the wafer is rotated while permitting the orientation-cut to strike some or all of the guide rollers. For this reason, the apparatus of the above-identified Japanese open patent is not suited for use in the manufacture of solid state devices using a multistep photomechanical reproduction process.

To minimize the probability of destroying semiconductive wafers, it is desirable to decrease the number of guide rollers which engage with the periphery of the wafer. In this respect, there is known another type automatic wafer orienting apparatus employing only one guide roller and a pair of reversely rotatable rotary heads, the arrangement of these parts being such that when the orientation-cut of the wafer is brought into contact with both of the rotary heads, the wafer is held from rotation in a desired orientation position. With this apparatus, however, the reverse rotatative movements of these two rotary heads are simultaneously applied to the periphery of the wafer causing the wafer to vibrate at any time so that the wafer is unstable in position during the orientation operation. In addition to such vibratory motion of the wafer, a difference between the friction coefficients of the two rotary heads for the periphery of the wafer and other various factors make it difficult to control the orientation position and location with high accuracy and reliability.

SUMMARY OF THE INVENTION

An object of the present invention is to provide an apparatus for automatically orienting a semiconductive wafer to a desired position at a predetermined location with high accuracy and reliability.

Another object of the invention is to provide an apparatus for automatically orienting a semiconductive wafer to a desired position without injury to the wafer.

Still another object of the invention is to provide an apparatus for automatically orienting a semiconductive wafer to a desired position without imparting any vibratory motion to the ultimately oriented wafer.

To achieve these objects, an automatic wafer orienting apparatus according to a prefered embodiment of the invention is essentially comprised of a rotary head, an idler and a guide abutment arranged on a common support plate having a number of holes bored therethrough to be switchable between pressure and vacuum by pump means and control means therefor. For adaptation to the orienting of a wafer having a distinctive peripheral feature such that an orientation reference, i.e., an orientation-cut or orientation-notch is distinctively formed in a portion of the periphery thereof with respect to the other round peripheral portion to provide a pair of resultant edges at the points of intersection between the orientation reference portion and the other round portion, the guide abutment is constructed as having a flat guide surface perpendicular to the support surface and positioned adjacent the rotary head on the opposite side to the idler so that as the wafer while being slightly floated from the support surface by application of an air through the holes thereto, and simultaneously impelled into abutting engagement at the periphery thereof with the rotary head and idler is rotated by the frictional force between the periphery of the wafer and the rotary head, one of the pair of edges strikes the flat surface of the guide abutment at a point from which it is slidingly moved in a linear direction along the flat guide surface to a point nearer to the rotary head where the rotary head imparts no more substantial rotative movement to the wafer. Upon completion of orientation of the wafer, the holes are switched from the pressure to vacuum to hold the wafer from rotation in the desired orientation position at a predetermined location with high accuracy and reliability.

This apparatus operates with a mask pattern printing apparatus associated with a transfer mechanism constructed in a manner known in the art as including a supply source for semiconductive wafers, rotary transport means such as belt conveyor, and indexing means, whereby randomly oriented wafers are automatically individually transferred to the support plate of the apparatus of the invention. After the support plate has received the wafer, the pump means connected to the holes of the support plate is operated to supply an air through the holes under such a pressure as to slightly float the wafer from the support surface. The axes of the holes are so oriented with respect to the support surface that the wafer is impelled into abutting engagement with the rotary head and the idler provided that the orientation reference portion is located outside of that portion of the range of movement of the wafer between the idler and rotary head to thereby define the area of rotation of the wafer about its axis. Under this situation, rotation of the rotary head driven by an electric motor though with a weak driving torque causes smooth rotative movement of the wafer about its axis while the wafer is stabilized against vibratory motion by engagement with the idler. As the wafer is rotated, the orientation reference portion reaches the rotary head, and a further rotation of the wafer causes one of the pair of edges to strike the flat guide surface of the guide abutment. At this time, the idler engages with the round peripheral portion and the rotary head with the orientation reference portion. A furthermore rotation of the wafer causes a sliding linear movement of the edge engaging the flat guide abutment surface to a point where the application of rotation of the rotary head to the wafer imparts no more rotative movement to the wafer as it is stably held from rotation by the idler and guide abutment, the location and orientation position of the held wafer depending upon the arrangement of these three essential parts. After that the holes are switched from the pressure to vacuum to secure the wafer to the support plate.

The foregoing and other objects, features and advantages of the invention will be apparent from the following more particular description of preferred embodiments of the invention, as illustrated in the accompanying drawings.

BRIEF DESCRIPTION OF THE DRAWINGS

FIG. 1 is a schematic top view of an embodiment of an automatic wafer orienting apparatus according to the present invention.

FIG. 2 is a schematic sectional view of the apparatus of FIG. 1 taken along lines X—X'.

FIGS. 3 and 4 are similar views of the embodiment of FIGS. 1 and 2 illustrating operating principles.

FIG. 5 is a sectional view of another embodiment of the present invention.

FIG. 8 is a plan view of another embodiment of the present invention.

DETAILED DESCRIPTION OF THE INVENTION

Figure 6:
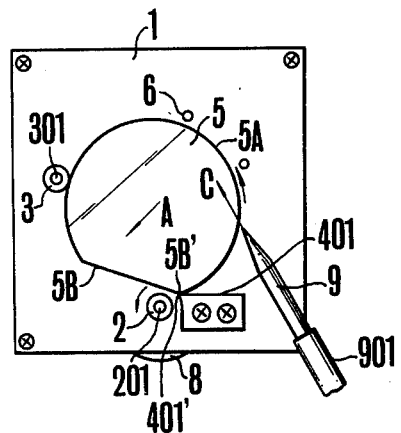
FIG. 6 is a schematic top view of another embodiment of the invention

In FIG. 1, there is shown a preferred embodiment of an automatic wafer orienting apparatus of the invention as incorporated in a mask-pattern printing apparatus. The automatic wafer orienting apparatus includes a support plate 1 having a smooth support surface for receiving and holding a semiconductive wafer. The support plate 1 is mounted through four legs 101 of FIG. 2 on a not shown turret which is intermittantly rotated by an indexing mechanism of construction known in the art, so that the support plate 1 is transported through a succession of at least the wafer orienting station and mask pattern printing station. In the printing station, the wafer is aligned with a photomask by an optical system which performs one of the projection, proximity and contact printing methods or a combination thereof. The following explanation will be made on assumption that the support plate 1 remains stationary in the orienting station, and accordingly the turret is stopped from rotation.

The support plate 1 is provided with a rotary head 2 arranged on the support surface to be rotatable with reference thereto and fixedly mounted on a drive shift 201 which is connected through a mechanical linkage such as a gear train to the output shaft of an electric motor 8 mounted on the lower side of the support plate 1. The operation of motor 8 is controlled by a control mechanism constructed in a manner known in the art, so that the rotary head is rotated so long as the support plate 1 stays in the orienting station. The orientor apparatus of the invention is particularly adapted to orient a wafer having a distinctive peripheral feature such that an orientation-cut is distinctively formed in the periphery with respect to the other round portion and having a size of from 2 inches (50 ± 2mm) to 3 inches (76 ± 2mm) in diameter. In this case, the rotary head 2 is driven for rotation at a speed of about 100r.p.m.. Positioned in spaced apart relation to the rotary head 2 is an idler 3 for guiding the periphery of the wafer rotatably mounted on a shaft 301 fixed on the support plate 1. A wafer received on the support surface is brought into abutting engagement at the periphery thereof with rotary head 2 and idler 3 so that the rotary head 2 and idler 3 are arranged in a circumference of a circle having a diameter equal to that of the wafer and having a center at a predetermined location point, and are spaced apart from each other by a distance smaller than the minimum diametral length of the water. The present inventor has experimentally found that the most effective spacing between the parts 2 and 3 is equal to that corresponding to an arc of about 120°. As the spacing is increased from this value, the wedge force applied by the parts 2 and 3 to the wafer is sharply increased. In other words, the wafer receives a sharply increasing reaction force from these parts 2 and 3, thereby the probabilty of destroying wafers is considerably increased. Conversely, a decrease in the spacing causes a decrease in the stabilization of the wafer against vibratory motion about idler 3, as it is rotated. The specific magnitude of the spacing between rotary head 2 and idler 3 does not constitute the essential parts of the invention. Therefore, the magnitude of the spacing may be limited in a range between the minimum diametral length of the wafer and a distance long enough to accurately define the area of movement of the wafer as it is rotated. In other words, a relatively wider spacing may be employed to orient a wafer of stronger physical strength, and a relatively narrow spacing may be employed in connection with a rotary head which is driven for rotation at a slower speed without encountering the above-mentioned drawback.

The orientor apparatus further includes a guide abutment 4 having a flat guide surface 401 for guiding an article in a linear direction positioned adjacent the rotary head 1 on the opposite side to the idler 3, the guide surface being oriented so that the guide surface 401 intersects a line connecting rotary head 2 and idler 3 at an angle of about 130°, and being arranged externally of the above-mentioned circle in so close relation to the circle that one of the pair of edges may strike the guide surface at a point as the wafer is rotated about its axis in a direction from rotary head 2 to the idler 3. In other words, the guide surface 401 is located as externally displaced from a line tangent to the above-mentioned circle at a point at which the periphery of the wafer engages with the periphery of rotary head 2 by a predetermined distance ΔC. The experiments conducted by the present inventor indicate that the distance ΔC is preferably smaller than 0.05 millimeter, or in a range of $0 \leq \Delta C \leq 0.05$ mm for the purpose of enabling the orientor apparatus to orient a wide variety of wafers of different size which may be usually encountered to selected positions related to each other. An increase in the distance ΔC from 0.05mm will cause an increase in the difficulty of establishing a relationship between the resultant orientation position as the wafer size is varied, which in turn reduces the uniformity and reliability of the final products. However, it is of course possible that as long as the wafers to be oriented have a specified size, the distance ΔC may take any value depending upon the specified wafer size provided that the edge can be brought into contact with the guide surface as it is rotated in engagement with the rotary head 2 and idler 3.

In order to facilitate the orientation operation, there is provided a number of holes 6 bored through the support plate 1 to apply a pressure or vacuum to the wafer received and held on the support surface. The openings of the holes on the support surface are arranged in two lines each making an angle of about 30° with respect to the surface 401 of guide abutment 4, and the axes of the holes 6 are oriented each to make an angle of about 60° with respect to the support surface as shown in FIG. 2 in each of the planes containing the respective hole opening lines and perpendicular to the support surface so that when the gas emits from the holes 6 with a pressure sufficient to slightly float the wafer, the wafer is impelled to abutting engagement at the periphery thereof with at least two of rotary head 2, idler 3 and guide abutment 4. It has experimentally been found by the present inventor that this arrangement and orientation of the holes 6 are most effective for performing the orientation of the wafer while still maintaining a good balance of the wafer in the rotative movement to the desired orientation position and controlling the final orientation position and location of wafer with high accuracy and reliability. All of the holes 6 ae aligned with a recess 601 formed in a back plate 102 which is air-tightly mounted on the lower side of the support plate 1. The recess 601 is connected to pump means not shown by a port 602 to be switchable between pressure and vacuum. The operation of the pump means for application of vacuum or pressure is controlled by not shown control means in synchronism with the operation of the turret. The control means of such performance may be conventional. The pump means continues to supply a small rate of air through the port 602 and recess 601 to the holes 6 during the entire orientation operation. After a predetermined time interval from the initiation of the orientation operation, or after the wafer has been oriented to a desired position, the pump means is switched from the pressure to vacuum to hold the wafer in the finally oriented position at the predetermined location. In the embodiment employing the holes each inclined from the normal line of the support surface, it is preferred to dispose the support plate 1 with the support surface being inclined from a horizontal plane by about '° as the rotary head 2, the idler 3 and the guide abutment 4 displaced downwards. In this case, an alternate support plate having a number of holes 6, some of which are perpendicular to the support surface may be employed.

In FIG. 5, a support plate 1 has a number of holes 6, all of which are perpendicular to the support surface. In this case, the support surface is inclined by an angle $\theta$ of 2° from a horizontal plane H in a plane perpendicular to the support surface and parallel to the line of hole openings 6, so that a component G' of the gravity force G of the floated wafer 5 which is parallel to the support surface and in the direction of the middle point between the rotary head 2 and the idler 3 is almost equal to that component of the force applied by the air flow from the holes 6 which is inclined from the normal line of the support surface of the plate 1 as shown in FIG. 2. In the figures, the holes 6 are illustrated as regularly arranged in the support plate, but the hole arrangement is not confined thereto, for example, all of the holes 6 may be randomly arranged. Although not shown in the figures, a transfer apparatus is provided in the mask pattern printing apparatus for cooperation with the orientor apparatus when it enters the orienting station of the printing apparatus, whereby randomly oriented wafers are automatically individually transferred from the wafer carrier as the wafer supply source through indexing means and transporting means such as belt and air conveyors to the support plate 1 of the orientor apparatus in a direction parallel to the line of hole openings 6 which will be hereinafter referred to as "direction A". Instead of using the transfer apparatus, each wafer may be manually inserted onto the support plate 1 from the direction A.

The operation of the orientor apparatus of FIGS. 1 and 2 will next be explained by reference to FIGS. 3 and 4. When the orientor apparatus enters the orienting station of the printing apparatus, the motor 8 is energized and the pump means is operated to supply a gas 7 such as air through the holes 6 to the support surface onto which a wafer 5 which is initially oriented as shown in FIG. 3 is then inserted from the direction A by the automatic wafer transferring apparatus while it being floated from the support surface by a distance of 0.1 to 0.2 millimeter to reduce the frictional force between wafer 5 and support plate 1 substantially to zero. As the force of the gas flow emitting from the holes 6 has a component in direction A, the wafer is moved in direction A until it abuts both of the rotary head 2 and idler 3. As the rotary head 2 is rotated by motor 8 in a counter-clockwise direction, wafer 5 is driven for rotation about its axis passing through the center of a circle defined by the circular peripheral portion 5A in a clockwise direction by the frictional force exerted between wafer 5 and rotary head 2. Because of no frictional force between the support plate 1 and wafer 5, wafer 5 begins to rotate smoothly and the peripheral speed of the wafer 5 reaches a level almost equal to that of the rotary head 2 in a short time interval. Further, wafer 5 is stably supported between the rotary head 2 and idler 3 to prevent the impartment of any vibratory motion to wafer 5. As wafer 5 is rotated, the linear orientation-cut peripheral portion 5B reaches the rotary head 2, so that the center of wafer 5 begins to slowly displace in direction A. From this moment, the rotation of rotary head 2 is applied to wafer 5 through the orientation-cut portion 5B. When the amount of displacement of the wafer center has readed a level depending upon the distance ΔC, wafer size and orientation-cut configuration and its size, the right hand edge 5B' formed at the point of intersection between portions 5A and 5B strikes the guide surface 401 of guide abutment 4 at a point. In this stage of rotation of wafer 5, the abutting engagement of the orientation-cut portion 5B with rotary head 2 is retained causing a further clockwise rotation of wafer 5 while still causing the edge 5B' to be slidingly moved along the guide surface 401 in a linear direction to a point where rotary head 2 imparts no substantial rotative movement to wafer 5 as the force of supporting wafer 5 is applied to idler 3 and guide abutment 4 but not to rotary head 2. In other words, the portion 5B of wafer 5 is taken out of substantial contact with the periphery of rotary head 2. At this time, wafer 5 assumes the desired orientation position at the predetermined location in which wafer 5 is stabilized against any residual rotative movement because the abutting engagement of the round peripheral portion 5a and edge 5B' of wafer 5 with idler 3 and guide abutment 4 respectively results in application of so-called "wedge-like force" to wafer 5. The position and location of the ultimately orientated wafer 5 can be adjusted in accordance with the condition of alignment with the photomask in the printing apparatus by varying the arrangement of rotary head 2, idler 3 and guide abutment 4. After a time interval of eight seconds for a wafer of 2 inches diameter, or twelve seconds for a wafer 3 inches diameter through depending upon the periphral configuration of wafer 5 and the speed of rotary head 2 from the insertion of wafer 5 to the support plate 1 (this time interval is predetermined in relation to the speed of rotary head 2 as being sufficient for the orientor apparatus to orient a wafer which is received in any orientation position to the predetermined one), port 602 is switched from pressure to vacuum so that wafer 5 is fixedly secured to the support plate 1. As mentioned before, the inclination of the support plate 1 from the horizontal plane by an angle of about 1° causes a downward sliding movement of wafer 5 in steady engagement with guide abutment 4 and idler 3, while it being insured that the orientation position and location of wafer 5 which is resulted when it is being floated are preserved after it has been deposited on the support surface by the vacuum application. After the wafer 5 has been oriented to the desired position, the support plate 1 with wafer 5 thereon is transferred to the next station as the turret is operated, or the wafer 5 alone may be transferred to the next station by transport means having air chucks while the orientation position is preserved.

Although the foregoing explanation of the operation of the orientor apparatus has been made in connection with a specific example thereof in which the axes of holes 6 are inclined from the normal line of the support surface of plate 1, the operating principle is the same in another orientor apparatus shown in FIG. 5 in which all of the holes 6 are perpendicularly bored with respect to the support surface, and instead this support surface is inclined from a horizontal plane by a larger angle of about 2° except for the nature of the force of impelling the wafer to abutting engagement with at least two of the rotary head 2, the idler 3 and the guide abutment 4 depending on whether it is a pressure of the gas flow emitting from the holes 6, or the weight of gravity.

The present invention has been described in connection with a schematic example which can be changed in many ways. For example, instead of using a roller as the idler 3, it is possible to use a pin fixedly mounted on the support plate. The idler 3 may be in the form of an inverted cone as well as a cylinder. In the case of an inverted cone idler 3, the wafer 5 is prevented from being undesireably displaced in the upward direction as well as in the lateral direction. Of course, the vertical angle of the cone may take any value. Further, the rotary head 2 may be in the form either of a cylinder, or of an inverted cone. The rotary head 2 in the form of an inverted cone will limit the upward and lateral displacements of the wafer 5. Moreover, the rotary head 2 may be replaced by an endless belt conveyed on a pair of pulleys. In this case, one of the pair of pulleys is positioned in place of rotary head 2 and an endless belt is trained over this pulley in a manner to normal contact with the periphery of the wafer. The other pulley is driven for rotation by an electric motor 8 with its output shaft arranged in spaced relation to the shaft of the former pulley, thereby the wafer is rotated in engagement with the belt.

Figure 7:
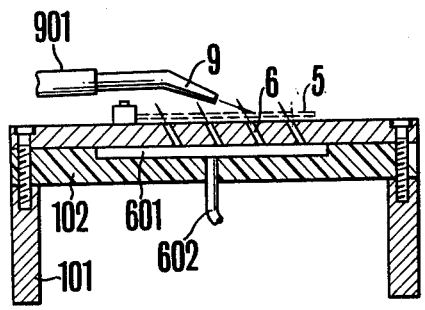
FIG. 7 is a partly perspective partly sectional view of the apparatus of FIG. 6, the sectional part illustrating a structure similar to that of FIG. 2.

FIGS. 6 and 7 show another embodiment of the invention, wherein the parts similar to those of FIGS. 1 and 2 are designated by the same reference characters. Numeral 9 indicates a nozzle for imparting a reverse rotative movement to the wafer 5 being oriented. The nozzle 9 is arranged in the orienting station of the pattern printing apparatus as fixedly supported by a rigid member extending from the frame of the printing apparatus, or as rotatably supported thereon at a shaft perpendicular to the support surface of plate 1. The nozzle 9 is so oriented that the direction in which a jet of gas C emits from its opening makes an angle of 30° to 45° with respect to the support surface of plate 1, and that the gas jet C is directed to the vicinity of the periphery of wafer 5 which is being rotated in the clockwise direction in engagement with rotary head 2 and idler 3 and guide abutment 4. The pressure of the gas jet C applied to wafer 5 is controlled so as to rotate wafer 5 in the counter-clockwise direction by an angular direction of 30° to 40° despite of the fact that the rotary head 2 is applying a clockwise rotative movement to the wafer 5. The nozzle 9 is connected to not shown pump means therefor through a pipe 901. The actuation and operation of this pump means is controlled by control means known in the art in such a manner that at a middle point of duration of a time interval during which the orientation operation of wafer 5 is carried out (this time interval is predetermined in relation to the speed of rotary head 2 and other factors as being sufficient for orienting the wafer which may be received in any orientation position to the predetermined one), nozzle 9 is allowed to blow a jet of gas such as air for a time period of about 0.5 to 1 second (short enough not to exceed the above-mentioned time interval necessary for the entire orientation operation) in synchronism with the operation of the printing apparatus.

When it has happened that a wafer 5 inserted onto support plate 1 initially assumes an orientation position shown in FIG. 6, wherein the edge 5B' falls in a range between a point on the guide surface 401 at which the wafer 5 assumes the desired orientation position and a point in a space between rotary head 2 and the edge 401' of the guide abutment at which rotary head 2 is brought into, or taken out of contact with the orientation-cut portion 5B of wafer, this state being encountered at a probability once every 200 to 300 wafers, and being called "dead point state," wafer 5 is not driven for rotation to the desired position, because of the disengagement of wafer 5 from rotary head 2. With the orientor apparatus of FIGS. 6 and 7, this is overcome by operating the above-mentioned gas supply means connected to nozzle 9. When a gas jet C is applied to wafer 5, it is turned in a counter-clockwise direction by an angular distance of 30° to 40° about its axis, being caused to escape from the dead-point state. After that, the nozzle 9 is stopped from emitting the gas jet. The subsequent portion of the orientation operation proceeds in a manner similar to that shown in connection with FIGS. 3 and 4.

In a succession of orienting operations, randomly oriented wafers are individually supplied to the support plate 1, some of which will be inserted in orientation positions shown in FIGS. 3 and 4. Even in these cases, the orientor apparatus of FIGS. 6 and 7 operates with the nozzle 9 causing these wafer to be turned in the counter-clockwise direction through a certain angle. However, the time interval necessary for performing the entire orientation operation is so short that the prolonged portion of the time interval by the impartment of reverse rotation to each wafer will not considerably slow the overall wafer handling capability of the printing apparatus.

Although the embodiment of FIGS. 6 and 7 has been described and illustrated as employing a nozzle 9 arranged above the support plate 1, it may be replaced by a hole bored in support plate 1 to perform a function similar to that of nozzle 9. In this case, the nozzle hole has to be located at a point with which is aligned the vicinity of the periphery of wafer 5, while it being engaging rotary head 2, idler 3 and guide abutment 4, and to be directed so that, upon application of a gas flow, wafer 5 is rotated in the counter-clockwise direction despite of the fact that rotary head 2 is applying a clockwise rotative movement to wafer 5. Another modification may be made by imparting a function similar to that of nozzle 9 to idler 3. In FIG. 8, an additional motor 8' may be employed for operative connection to idler 3 through a suitable control mechanism. In this case, idler 3 is rendered operative for reverse rotation to that of rotary head 2, in this instance, for clockwise rotation, in a timing manner identical to that of the actuation and operation of nozzle 9. Such control mechanism may be constructed in a manner known in the art. In this case, the idler 3 when rendered inoperative function as a pin.

Although the above-mentioned embodiments of the invention are adapted to orient wafers, each having an orientation-cut, the invention may be adapted to orient wafers, each having an orientation-notch. In this case, the location of rotary head 2 has to be changed from that of FIGS. 1 or 6 in accordance with the degree of curvature of the recessed portion. Further, the size of rotary head 2 has to be made smaller than the length of opening of the recessed portion to permit a continuous rolling engagement of rotary head with the recessed portion over the entire length thereof.

What is claimed is:

1. An apparatus for automatically orienting a wafer to a desired position, said wafer having an orientation reference peripheral portion distinctively formed with respect to the other peripheral portion and having a pair of resultant edges formed in the periphery at the intersecting points between said orientation reference portion and the other portion, said apparatus comprising;
    a. a support plate for receiving and holding said wafer,
    b. a rotary head positioned on said support plate upon engagement with the periphery of said wafer to apply a rotative movement to said wafer,
    c. an idler arranged on said support plate in spaced apart relation to said rotary head to define an area of movement of said wafer as the wafer is rotated by said rotary head,
    d. a guide abutment having a flat guide surface for guiding one of said the pair of edges in a linear direction positioned adjacent said rotary head on the opposite side of said rotary head to said idler to interact with said edge in such a manner that as the wafer is rotated by said rotary head, said edge strikes said flat guide surface at a point from which it is slidingly moved along said flat guide surface to a certain point where said rotary head imparts no more substantial rotative movement to said wafer.

2. An apparatus for automatically orienting a wafer to a desired position, said wafer having a circular periphery provided with an orientation reference portion distinctively formed therein with respect to the other portion and with a pair of resultant edges formed in the periphery at the intersecting points between said orientation reference portion and the other portion, said apparatus comprising;
    a. a support plate for receiving and holding said wafer,
    b. a rotary head positioned on said support plate upon engagement with the periphery of said wafer to apply rotative movement of said wafer,
    c. an idler arranged on said support plate to be engageable with the periphery of said wafer at a point spaced apart from the point at which said rotary head engages the periphery of said wafer by a predetermined distance smaller than the diameter of said wafer,
    d. a guide abutment having a flat guide surface for guiding one of said pair of edges in a linear direction positioned adjacent said rotary head on the opposite side of said rotary head to said idler so that said flat guide surface is spaced from a circle passing said two points and having a diameter equal to that of said wafer by a distance such that said one edge is engageable with said flat guide surface as said wafer is rotated, and
    e. means for impelling said wafer to abutting engagement at the periphery thereof with at least two of said rotary head, said idler and said guide abutment.

3. An apparatus according to claim 2, which further comprises; means for applying to said wafer a reversely rotative movement with respect to that which said rotary member applies thereto, the application of said reversely rotative movement being carried out for a short period of time in a predetermined time interval after the initiation of said orientation operation to cause a rotation of said wafer in the opposite direction to that in which said wafer would be otherwise rotated by said rotary member, and after the termination of duration of said short period of time, said wafer being permitted to rotate again in the forward direction by said rotary member to said desired orientation position.

4. An apparatus according to claim 3, wherein said reverse rotation applying means comprises;
   a nozzle disposed so that a jet of gas from said nozzle is directed to at least the vicinity of the periphery of said wafer engaging with at least two of said rotary head, said idler and said guide to apply to said wafer a reversely rotative movement with respect to that said rotary member applies thereto, and
   a gas supply means connected to said nozzle to supply pressurized gas to said nozzle during the duration of said time period.

5. An apparatus according to claim 3, wherein said reverse rotation applying means comprises;
   driving means operatively connected to said idler in such a manner that during the duration of said short period of time, said idler is driven by said driving means so as to rotate said wafer in the opposite direction to that in which it would be otherwise rotated by said rotary member.

6. An apparatus for automatically orienting a wafer to a desired position, said wafer having an orientation reference peripheral portion distinctively formed with respect to the other peripheral portion and having a pair of resultant edges formed in the periphery at the intersecting points between said orientation reference portion and the other portion, said apparatus comprising;
   a. a support plate having a support surface for receiving and holding said wafer,
   b. a plurality of holes provided through said support plate to be switchable between pressure and vacuum,
   c. pump means associated with said the plurality of holes upon application of pressure thereto for floating said wafer from said surface when the wafer is rotated to said desired orientation position, and upon application of vacuum thereto at the time when the orientation operation of the wafer is completed for securing said wafer in said position to said support surface,
   d. a rotary head positioned on said support plate upon engagement with the periphery of said wafer for applying rotative movement to said wafer while said wafer is being slightly floated from said support surface,
   e. an idler arranged on said support plate in spaced apart relation to said rotary head to define an area of movement of said wafer as it is rotated by said rotary head while it is being floated from said support surface; and
   f. a guide abutment having a flat guide surface for guiding one of said the pair of edges in a linear direction positioned adjacent said rotary head on the opposite side of said rotary head to said idler to interact with said one edge in such a manner that as the wafer is rotated by said rotary head while it is being floated from said support surface, said edge strikes said flat guide surface at a point from which it is slidingly moved along said flat guide surface to a certain point where said rotary head imparts no more substantial rotative movement to said wafer.

7. An apparatus according to claim 6, wherein said support surface is inclined from a horizontal plane by a predetermined angle as said rotary head, said idler and said guide abutment are displaced downwards.

8. An apparatus according to claim 6, wherein at least a fraction of said the number of holes are oriented with respect to said support surface so that the component parallel to said support surface of the overall pressure applied to said wafer through said holes impels said floated wafer to abutting engagement at the periphery thereof with at least two of said rotary head, said idler and said guide abutment.

9. An apparatus according to claim 6, wherein said holes are bored through said support plate in a direction perpendicular to the support surface, and the support surface is inclined from a horizontal plane by so large angle that the component parallel to the support surface of gravity of said floated wafer impels itself into abutting engagement at the periphery thereof with at least two of said rotary head, said idler and said guide abutment.

10. An apparatus for automatically orienting a wafer to a desired position, said wafer having a circular periphery provided with an orientation reference portion distinctively formed therein with respect to the other portion and with a pair of resultant edges formed in the periphery at the intersecting points between said orientation reference portion and the other portion, said apparatus comprising;
   a. a support plate having a support surface for receiving and holding said wafer,
   b. a plurality of holes provided through said support plate,
   c. pump means associated with said the plurality of holes upon application of pressure thereto for floating said wafer from said support surface when the wafer is rotated to said desired orientation position, and upon application of vacuum thereto at the time when the orientation operation of the wafer is completed for securing said wafer to said support surface in said desired orientation position,
   d. a rotary head positioned on said support plate upon engagement with the periphery of said wafer to apply rotative movement to said wafer while said wafer is being floated from said support surface,
   e. an idler arranged on said support plate to be engageable with the periphery of said wafer at a point spaced apart from the point at which said rotary head engages the periphery of said wafer by a predetermined distance smaller than the diameter of said wafer, so that the rotation of said wafer is guided as it is rotated, while said wafer is being floated from said support surface; and
   f. a guide abutment having a flat guide surface for guiding one of said the pair of edges in a linear direction, while said wafer is being floated from said support surface, positioned adjacent said rotary head on the opposite side of said rotary head to said idler so that said flat guide surface is spaced from a circle passing said two points and having a diameter equal to that of said wafer by a predetermined distance.

11. An apparatus according to claim 10, wherein said support surface is inclined from a horizontal plane by a predetermined angle as said rotary head, said idler and said guide abutment are displaced downwards.

12. An apparatus according to claim 10, wherein at least a fraction of said the number of holes are oriented with respect to said support surface so that the component of the overall pressure applied to said wafer through said holes parallel to said support surface impels said floated water to abutting engagement at the periphery thereof with at least two of said rotary head, said idler and said guide abutment.

13. An apparatus according to claim 10, wherein said holes are bored through said support place in a direction perpendicular to the support surface, and said support surface is inclined from a horizontal plane by so large angle that the component parallel to the support surface of gravity of said floated wafer impels itself into abutting engagement at the periphery thereof with at least two of said rotary head, said idler and said guide abutment.

14. An apparatus according to claim 10, which further comprises; means for applying to said wafer a reversely rotative movement with respect to that which said rotary head applies thereto, the application of said reversely rotative movement being carried out for a short period of time in a predetermined time interval after the initiation of said orientation operation to cause a rotation of said wafer in the opposite direction to that in which said wafer would be otherwise rotated by said rotary head, and after the termination of duration of said short period of time, said wafer being permitted to rotate again in the forward direction by said rotary head to said desired orientation position.

15. An apparatus according to claim 14, wherein said reverse rotation applying means comprises;
  a nozzle disposed so that a jet of gas from said nozzle is directed to at least the vicinity of the periphery of said wafer engaging with at least two of said rotary head, said idler and said guide abutment to apply to said wafer a reversely rotative movement with respect to that said rotary member applies thereto, and
  a gas supply means connected to said nozzle to supply pressurized gas to said nozzle during the duration of said time period.

16. An apparatus according to claim 14, wherein said reverse rotation applying means comprises;
  driving means operatively connected to said idler in such a manner that during the duration of said short period of time, said idler is driven by said driving means so as to rotate said wafer in the opposite direction to that in which it would be otherwise rotated by said rotary member.

17. An apparatus for automatically orienting a wafer to a desired position, said wafer having an orientation reference peripheral portion distinctively formed with respect to the other peripheral portion and having a pair of resultant edges formed in the periphery at the intersecting points between said orientation reference portion and the other portion, said apparatus comprising;
  a. a support plate having a support surface for receiving and holding said wafer;
  b. a rotary head positioned on said support plate upon engagement with the periphery of said wafer to apply a rotative movement to said wafer,
  c. an idler arranged on said support plate in spaced apart relation to said rotary head to define an area of movement of said wafer as the wafer is rotated by said rotary head,
  d. a guide abutment having a flat guide surface for guiding one of said pair of edges in a linear direction positiioned adjacent said rotary head on the opposite side of said rotary head to said idler to interact with said edge in such a manner that as the wafer is rotated by said rotary head, said edge strikes said flat guide surface at a point from which it is slidingly moved along said flat guide surface to a certain point where said rotary head imparts no more substantial rotative movement to said wafer, and
  e. means for floating said wafer from said support surface during at least the duration of rotation of said wafer in the course of orientation operations to reduce the friction force between said support surface and the lower surface of said wafer substantially to zero.

18. An apparatus according to claim 17, wherein said support surface is inclined from a horizontal plane by a predetermined angle as said rotary head, said idler and said guide abutment are displaced downwards.

19. An apparatus according to claim 17, which further comprises; means for applying to said wafer a reversely rotative movement with respect to that which said rotary head applies thereto, the application of said reversely rotative movement being carried out for a short period of time in a predetermined time interval after the initiation of said orientation operation to cause a rotation of said wafer in the opposite direction to that in which said wafer would be otherwise rotated by said rotary head, and afer the termination of duration of said short period of time, said wafer being permitted to rotate again in the forward direction by said rotary head to said desired orientation position.

20. An apparatus according to claim 19, wherein said reverse rotation applying means comprises;
  a nozzle disposed so that a jet of gas from said nozzle is directed to at least the vicinity of the periphery of said wafer engaging with at least two of said rotary head, said idler and said guide abutment to apply to said wafer a reversely rotataive movement with respect to that said rotary member applies thereto, and
  a gas supply means connected to said nozzle to supply pressurized gas to said nozzle during the duration of said time period.

21. An apparatus according to claim 19, wherein said reverse rotation applying means comprises; driving means operatively connected to said idler in such a manner that during the duration of said short period of time, said idler is driven by said driving means so as to rotate said wafer in the opposite direction to that in which it would be otherwise rotated by said rotary member.

* * * * *